United States Patent
Egbe et al.

(10) Patent No.: US 7,361,631 B2
(45) Date of Patent: Apr. 22, 2008

(54) COMPOSITIONS FOR THE REMOVAL OF ORGANIC AND INORGANIC RESIDUES

(75) Inventors: Matthew I. Egbe, West Norriton, PA (US); Jennifer M. Rieker, Bethlehem, PA (US); Darryl W. Peters, Stewartsville, NJ (US); Irl E. Ward, Bethlehem, PA (US)

(73) Assignee: Air Products and Chemicals, Inc., Allentown, PA (US)

( * ) Notice: Subject to any disclaimer, the term of this patent is extended or adjusted under 35 U.S.C. 154(b) by 152 days.

(21) Appl. No.: 10/942,290

(22) Filed: Sep. 15, 2004

(65) Prior Publication Data

US 2005/0119143 A1    Jun. 2, 2005

Related U.S. Application Data

(63) Continuation-in-part of application No. 09/238,851, filed on Jan. 27, 1999, now Pat. No. 6,828,289.

(51) Int. Cl.
*C11D 3/30* (2006.01)
(52) U.S. Cl. .................. 510/175; 510/176; 252/79.3
(58) Field of Classification Search ............... 510/175, 510/176; 252/79.3
See application file for complete search history.

(56) References Cited

U.S. PATENT DOCUMENTS

| | | | | |
|---|---|---|---|---|
| 5,320,709 A | | 6/1994 | Bowden et al. | |
| 5,571,447 A | * | 11/1996 | Ward et al. | 510/206 |
| 5,698,503 A | * | 12/1997 | Ward et al. | 510/176 |
| 5,709,756 A | * | 1/1998 | Ward et al. | 134/1.3 |
| 5,798,323 A | * | 8/1998 | Honda et al. | 510/176 |
| 5,972,862 A | | 10/1999 | Torii et al. | |
| 6,030,932 A | * | 2/2000 | Leon et al. | 510/175 |
| 6,191,086 B1 | * | 2/2001 | Leon et al. | 510/175 |
| 6,245,155 B1 | * | 6/2001 | Leon et al. | 134/3 |
| 6,492,311 B2 | * | 12/2002 | Lee et al. | 510/176 |
| 2004/0016904 A1 | | 1/2004 | Baum | |

FOREIGN PATENT DOCUMENTS

| | | |
|---|---|---|
| EP | 0827188 | 3/1998 |
| EP | 0901160 | 3/1999 |
| WO | 9830667 | 7/1998 |

* cited by examiner

*Primary Examiner*—Gregory Webb
(74) *Attorney, Agent, or Firm*—Rosaleen P. Morris-Oskanian; Joseph D. Rossi

(57) ABSTRACT

A composition and method using same for removing photoresist and/or processing residue from a substrate are described herein. In one aspect, there is provided a composition for removing residue consisting essentially of: an acidic buffer solution having an acid selected from a carboxylic acid or a polybasic acid and an ammonium salt of the acid in a molar ratio of acid to ammonium salt ranging from 10:1 to 1:10; an organic polar solvent that is miscible in all proportions in water; a fluoride, and water wherein the composition has a pH ranging from about 3 to about 7.

10 Claims, No Drawings

COMPOSITIONS FOR THE REMOVAL OF ORGANIC AND INORGANIC RESIDUES

CROSS-REFERENCE TO RELATED APPLICATIONS

This application is a continuation-in-part of U.S. patent application Ser. No. 09/238,851, filed Jan. 27, 1999, now U.S. Pat. No. 6,828,289 the disclosure of which is incorporated herein by reference in its entirety.

BACKGROUND OF THE INVENTION

Disclosed herein are aqueous-based acidic compositions containing fluoride and organic, polar solvents for removal of photoresist and organic and inorganic etch or ash residues and processes for removal of photoresist and etch or ash residues.

In the manufacture of semiconductors and semiconductor microcircuits, it is frequently necessary to coat substrate materials with a polymeric organic substance. Examples of some substrate materials includes, aluminum, titanium, copper, silicon dioxide coated silicon wafer, optionally having metallic elements of aluminum, titanium, or copper, and the like. Typically, the polymeric organic substance is a photoresist material. This is a material which will form an etch mask upon development after exposure to light. In subsequent processing steps, this polymeric organic substance (photoresist) must be removed from the surface of the substrate. One common method of removing photoresist from a substrate is by wet chemical means. The wet chemical compositions formulated to remove the photoresist from the substrate must do so without corroding, dissolving, or dulling the surface of any metallic circuitry; chemically altering the inorganic substrate; or attacking the substrate itself. Another method of removing photoresist is by a dry ash method where the photoresist is removed by plasma ashing using either oxygen or forming gas (hydrogen). In many instances the plasma ash method leaves residues or by-products. The residues or by-products may be the photoresist itself or a combination of the photoresist, underlying substrate and etch gasses. These residues or by-products are often referred to as sidewall polymers, veils or fences.

Various compositions for wet chemical removal of photoresists and organic and inorganic etch residues are known in the art. U.S. Pat. No. 5,698,503 discloses a composition for removing photoresist and residue, containing a polyhydric alcohol, ammonium fluoride, an organic polar solvent, water, and an acidic buffering compound, and acetic acid in an amount sufficient to obtain a pH of greater than about 4 and less than 7. The patent discloses propylene glycol and polyoxyalkylene glycols as the polyhydric alcohol and compositions such as, dimethylsulfoxide, dimethyl acetamide, N-methyl pyrrolidone and gamma butyrolactone as the polar solvents. U.S. Pat. No. 5,676,760 discloses processing semiconductor substrates with an electrolyte solution of ammonium chloride, ammonium acetate, ammonium fluoride, ammonium nitrate, ammonium bromide, ammonium iodide, ammonium sulphate, ammonium oxalate, ammonium carbonate, ammonium citrate, HCl, or ammonia and mixing it with deionized water. U.S. Pat. No. 5,571,447 discloses a composition for removing photoresist and residue containing a polyhydric alcohol, fluoroboric acid, a fluoride containing compound and a polar solvent. The pH of the composition is less than 5. The patent discloses propylene glycol and polyoxyalkylene glycols as the polyhydric alcohol, and the polar solvent as preferably water and/or dimethylsulfoxide. U.S. Pat. No. 5,320,790 discloses a method for selectively removing organometallic residues, native silicon oxides, or damaged silicon oxides created in processing by contacting a substrate with an essentially anhydrous composition of ammonium fluoride salt dissolved in a polyhydric alcohol. The patent discloses only glycols as examples of polyhydric alcohols.

Compositions such as those described may exhibit one or more of the following shortcomings. Solvent blends containing DMSO and fluoride (i.e., ammonium fluoride, HF, etc.) pose health risks to users due to the ability of DMSO to transport dissolved materials through the skin. In addition, many of the known compositions containing fluorides do not effectively remove photoresist at room temperature and at elevated temperatures exhibit unacceptably high oxide and metal etch rates. These compositions cannot be used at the contact or via level due to their high oxide etch rate and loss of critical control for patterns. It is the purpose of the present invention to provide compositions that exhibit little human or environmental toxicity; provide greater and more efficient ease of use; minimize corrosion of sensitive metals such as, aluminum, copper, titanium, and the like; and provide photoresist and residue removal at lower temperatures.

BRIEF SUMMARY OF THE INVENTION

The composition disclosed herein is an aqueous, buffered solution having a pH ranging from about 3 to about 7 and contains an organic polar solvent, a fluoride, an acidic buffer solution, and water. The composition may optionally include a corrosion inhibitor. The composition is used to remove photoresist and/or ash or etch residues formed during the processing of substrates used in the manufacture of semiconductor and microelectronic devices. The method of removal using the compositions described herein is carried out by contacting a substrate having photoresist and/or etch or ash residue on its surface with the compositions described herein. The actual conditions of the process depend among other things on the type of substrate and the material being removed. A general scheme for removal of a photoresist and/or etch or ash residue would consist of the steps of contacting a substrate with the composition of the present invention at temperatures of at least room temperature; maintaining contact between the substrate and the composition for a predetermined period of time; rinsing with water; and drying with an inert gas.

DETAILED DESCRIPTION OF THE INVENTION

An aqueous, acidic, buffered composition and method of removing photoresist and/or etch or ash residue from the surface of a substrate of a semiconductor or microelectronic device using same are disclosed herein. The composition comprises an acidic buffer solution, a polar solvent that is miscible in all proportions in water, a fluoride, and water. In certain embodiments, the composition is adjusted to a pH ranging from about 3 to about 7 and optionally includes a corrosion inhibitor and other additives that are typically used in compositions for removing photoresist and/or etch or ash residue.

Preferably, the composition is comprised of an acidic buffer solution in an amount necessary to obtain a composition with a pH ranging from 3 to 7; 30% by weight to 90% by weight of an organic polar solvent that is miscible in all proportions in water; 0.001% by weight to 20% by weight of a fluoride; 0.5% by weight to 40% by weight water; and up to 15% by weight of a corrosion inhibitor.

As mentioned previously, the composition described herein includes an acid buffer solution. The acidic buffer solutions, when added to the compositions disclosed herein, provide a buffered composition with a pH adjusted to minimize corrosion of sensitive metals such as aluminum, copper, titanium, etc. The acidic buffer solution is added in an amount that is necessary to obtain the desired pH range for the composition. The term "acid buffer solution" as used herein, is a solution that resists changes in pH as a result of small additions of acids or bases to the composition. The addition of the acidic buffer solutions to the compositions disclosed herein prevents pH swings due to dilution with water or contamination by bases or acids.

The molar ratio of acid to its conjugate base in the acid buffer solution to provide such a buffering effect within the composition ranges from 10:1 to 1:10, or substantially 1:1 (i.e., equimolar concentration). Buffers are typically thought of as weak acids and the widest buffering range against either an acid or a base is about one pH unit on either side of the $pk_a$ of the weak acid group. Setting the pH for the buffer may be accomplished by having an molar ratio of acid to base ranging from 10:1 to 1:10 or substantially 1:1 of the acid and conjugate base for the acid (or in certain embodiments a protonated base) with the appropriate $pk_a$ for the desired pH range.

In certain preferred embodiments, the acid buffer solution contains an ammonium salt of a carboxylic acid or a polybasic acid. Exemplary acid buffer solutions may include acetic acid/acetate salts (e.g., ammonium salt, amine salts, etc.), benzoic acid/benzoate salts (e.g., ammonium salt, amine salts, etc.), and phenolic acid/phenolate salts (e.g., ammonium salt, amine salts, etc.). An example of an ammonium salt is an ammonium salt of acetic acid or phosphoric acid. In one embodiment, the acid buffer solution is an aqueous solution of ammonium acetate and acetic acid. In yet another embodiment, the acid buffer solution is benzoic acid and ammonium benzoate.

In certain embodiments, the acid buffer solution may contain a weak acid such as trihydroxybenzene, dihydroxybenzene, and/or salicylhydroxamic acid. In these embodiments, the amount of weak acid added may range from 0.5 to 10% by weight or from 0.5 to 3% by weight.

In certain embodiments, a pH ranging from about 3 to about 9, or ranging from about 3 to about 7, or ranging from about 3 to about 6 will allow most sensitive metals to passivate with minimum corrosion. Removal of highly inorganic etch residues and oxide skimming may require a slightly acidic pH. The pH of the composition disclosed herein is adjusted to a range of about 3 to about 7 for best efficacy for cleaning etch residue and passivation of metals. The pH of the compositions of the described herein are adjusted to a desired pH within a pH range of about 3 to about 7 with acidic buffer solutions. Preferably, the pH range is from about 3 to about 7.

One or more organic polar solvents that are added to the compositions disclosed herein are those solvents that are miscible in water. These solvents may be used alone or in combination. Examples of organic polar solvents include, but are not limited to, dimethylacetamide (DMAC), monoethanolamine, n-methylethanolamine, formamide, n-methyl formamide, gamma-butyrolactone, N-methylpyrrolidone, and the like. Still further solvents include dihydric and polyhydric alcohols such as diols and polyols such as $(C_2-C_{20})$ alkane diols and $(C_3-C_{20})$ alkane triols, cyclic alcohols and substituted alcohols. Particular examples of these organic polar solvents are propylene glycol, tetrahydrofurfuryl alcohol (THFA), diacetone alcohol and 1,4-cyclohexanedimethanol.

In certain embodiments, the organic polar solvent may be a glycol ether. The glycol ethers are typically water miscible and may include glycol mono($C_1-C_6$)alkyl ethers and glycol di($C_1-C_6$)alkyl ethers, such as but not limited to, $(C_1-C_{20})$ alkane diols, $(C_1-C_6)$alkyl ethers, and $(C_1-C_{20})$alkane diol di($C_1-C_6$)alkyl ethers. Examples of glycol ethers are ethylene glycol monomethyl ether, ethylene glycol monoethyl ether, ethylene glycol monobutyl ether, ethylene glycol dimethyl ether, ethylene glycol diethyl ether, diethylene glycol monomethyl ether, diethylene glycol monoethyl ether, diethylene glycol monopropyl ether, diethylene glycol monoisopropyl ether diethylene glycol monobutyl ether, diethylene glycol monoisobutyl ether, diethylene glycol monobenzyl ether, diethylene glycol dimethyl ether, diethylene glycol diethyl ether, triethylene glycol monomethyl ether, triethylene glycol dimethyl ether, polyethylene glycol monomethyl ether, diethylene glycol methyl ethyl ether, triethylene glycol ethylene glycol monomethyl ether acetate, ethylene glycol monoethyl ether acetate, propylene glycol monomethyl ether, propylene glycol dimethyl ether, propylene glycol monobutyl ether, propylene glycol, monoproply ether, dipropylene glycol monomethyl ether, dipropylene glycol monopropyl ether, dipropylene glycol monoisopropyl ether, dipropylene monobutyl ether, dipropyllene glycol diisopropyl ether, tripropylene glycol monomethyl ether, 1-methoxy-2-butanol, 2-methoxy-1-butanol, 2-methoxy-2-methylbutanol, 1,1-dimethoxyethane and 2-(2-butoxyethoxy) ethanol. More typical examples of glycol ethers are propylene glycol monomethyl ether, propylene glycol monopropyl ether, tri(propylene glycol) monomethyl ether and 2-(2-butoxyethoxy) ethanol.

Fluoride is present in the compositions described herein. Fluoride-containing compounds include those of the general formula $R_1R_2R_3R_4NF$ where $R_1$, $R_2$, $R_3$, and $R_4$ are independently hydrogen, an alcohol group, an alkoxy group, an alkyl group or mixtures thereof. Examples of such compounds are ammonium fluoride, tetramethyl ammonium fluoride, tetraethyl ammonium fluoride. Fluoroboric acid can also be used as the fluoride compounds. Still further examples of fluoride-containing compounds include fluoroboric acid, hydrofluoric acid, and choline fluoride. The fluoride is preferably present in amounts of from 0.001% by weight to 20% by weight or from 0.1% by weight to 10% by weight. Ammonium fluoride is preferred. In these embodiments, ammonium fluoride may be available commercially as a 40% aqueous solution.

Water is present as an element of the present invention. It can be present coincidentally as a component of other elements of the invention such as an aqueous ammonium fluoride solution or an aqueous acidic buffer solution, or it can be added separately. Preferably, water is present in amounts of from 0.5% by weight to 40% by weight. In certain embodiments, the presence of water may improve the solubility of ammonium fluoride in the compositions of the present invention and aids in the removal of photoresist and cleaning of inorganic etch residues.

Corrosion inhibitors in an amount of up to 20% by weight can be added to compositions of the present invention. Preferably, the inhibitor concentration is from about 0.5% by weight to 8% by weight. Any corrosion inhibitor known in the art for similar applications, such as those disclosed in U.S. Pat. No. 5,417,877 which are incorporated herein by reference may be used. In certain embodiments, it has been found that inhibitor compositions with a pKa greater than 6 do not function as well as inhibitor compositions having a pKa of less than about 6 in systems with a pH range of about 3 to about 6. Therefore, preferred inhibitor compositions are those having a pKa of about 6 or less. Corrosion inhibitors may be an organic acid, an organic acid salt, a phenol, a triazole, or a hydroxylamine. Examples of preferred inhibitor compositions include anthranilic acid, gallic acid, benzoic acid, isophthalic acid, maleic acid, fumaric acid, D,L-malic acid, malonic acid, phthalic acid, maleic anhydride, phthalic anhydride, carboxybenzotriazole, diethyl hydroxylamine and the lactic acid and citric acid salts thereof, and the like. Further examples of corrosion inhibitors that may be used include catechol, pyrogallol, and esters of gallic acid.

The composition may also include one or more of the following additives: surfactants, chelating agents, chemical modifiers, dyes, biocides, and other additives. The additive(s) may be added to the extent that they do not adversely affect the pH range of the composition. Some examples of representative additives include acetylenic alcohols and derivatives thereof, acetylenic diols (non-ionic alkoxylated and/or self-emulsifiable acetylenic diol surfactants) and derivatives thereof, alcohols, quaternary amines and di-amines, amides (including aprotic solvents such as dimethyl formamide and dimethyl acetamide), alkyl alkanolamines (such as diethanolethylamine), and chelating agents such as beta-diketones, beta-ketoimines, carboxylic acids, mallic acid and tartaric acid based esters and diesters and derivatives thereof, and tertiary amines, diamines and triamines. In certain embodiments, the carboxylic acid that may be added to the composition in the acid buffer solution may also serve as a chelating agent.

Materials removed with the compositions described herein include photoresists known in the art such as novolak and acrylic based resists; and processing residues known in the art by such names as sidewall polymers, veils, fences etch residue, ash residue and the like. The compositions disclosed herein are compatible with low-k films such as HSQ (FOx), MSQ, SiLK, etc. The formulations are also effective in stripping photoresists including positive and negative photoresists and plasma etch residues such as organic residues, organometallic residues, inorganic residues, metallic oxides, or photoresist complexes at low temperatures with very low corrosion of aluminum, copper, titanium containing substrates. Moreover, the compositions are compatible with a variety of high dielectric constant materials.

During the manufacturing process, a photoresist layer is coated on the substrate. Using photolithographic process, a pattern is defined on the photoresist layer. The patterned photoresist layer is thus subjected to plasma etch by which the pattern is transferred to the substrate. Etch residues are generated in the etch stage. Some of the substrates used in this invention are ashed while some are not ashed. When the substrates are ashed the main residues to be cleaned are etchant residues. If the substrates are not ashed, then the main residues to be cleaned or stripped are both etch residues and photoresists.

The process described herein may be conducted by contacting a substrate having an organic or metal-organic polymer, inorganic salt, oxide, hydroxide, or complex or combination thereof present as a film or residue, with the described composition. The actual conditions, e.g. temperature, time, etc. depend on the nature and the thickness of the material to be removed. In general, the substrate is contacted or dipped into a vessel containing the composition at a temperature ranging from 20° C. to 80° C., or from 20° C. to 60° C., or from 20° C. and 40° C. Typical time periods for exposure of the substrate to the composition may range from, for example, 0.1 to 60 minutes, or 1 to 30 minutes, or 1 to 15 minutes. After contact with the composition, the substrate may be rinsed and then dried. Drying is typically carried out under an inert atmosphere. In certain embodiments, a deionized water rinse or rinse containing deionized water with other additives may be employed before, during, and/or after contacting the substrate with the composition described herein.

The compositions of this invention are especially useful and advantageous for one or more of the following reasons. The compositions are water soluble, non-corrosive to substrates, non-flammable and/or of low toxicity. The compositions effectively remove photoresist and etch residues at temperatures as low as 20° C. The compositions are particularity suitable for use with etched via patterns to remove etch residues and photoresist while maintaining critical dimension size. The compositions of the present invention may be easily rinsed from substrates and provide for better wetting of the substrates.

Having described the invention, the following examples are provided to further illustrate and are not intended to limit the present invention. In the examples below, unless otherwise specified, pH determinations were made using 5% aqueous solutions at ambient temperature and surface tension and viscosity measurements were made at 25° C.

EXAMPLE 1

A composition according to the present invention was prepared by mixing the

| Component | Wt % |
| --- | --- |
| Acetic acid (glacial) | 12.0 |
| Ammonium acetate | 15.2 |
| DMAC | 57.5 |
| Ammonium fluoride (40% aq) | 2.5 |
| Water (deionized) | 12.4 |

The pH of the composition was 4.75. The surface tension of the composition was 28 mN/m and the viscosity was 10 cps.

EXAMPLE 2

Comparison

A composition according to example 2 in U.S. Pat. No. 5,698,503 was prepared by mixing the following ingredients:

| Component | Wt % |
| --- | --- |
| Acetic acid (glacial) | 4.0 |
| Ammonium acetate | 5.2 |
| Propylene glycol | 73.0 |
| DMSO | 12.3 |
| Ammonium fluoride (40% aq) | 5.0 |
| Catechol | 0.5 |

The pH of the composition was 4.8. The surface tension was 45 mN/M; and the viscosity was 40 cps. The above composition did not remove photoresist at 20° C. or 40° C.

The rate of etch of an Al/Cu alloy, titanium, tungsten, a TiN alloy and thermal oxide in a bath containing the above composition was measured at 20° C., 40° C., and 60° C. The immersion bath method of example 3 was used. Metal etch rates were determined using a Veeco FPP-5000 four-point probe system for blanket metal films on thermal oxide. Thermal oxide etch rates were determined using a nanospec AFT optical thickness measurement tool. Etch rates are provided in Angstroms/minute. Results are given below in Table I.

TABLE I (Etch rates in Å/min)

| Temperature (° C.) | Al/Cu Alloy | Titanium | Tungsten | TiN Alloy | Thermal Oxide |
|---|---|---|---|---|---|
| 20 | 9 | 0 | 0 | 0 | 9 |
| 40 | 2 | 4 | 0 | 0 | 46 |
| 60 | 3 | 14 | 0 | 4 | Delam. |

EXAMPLE 3

The formulation of example 1 was used to remove ash and etch residue from a substrate with 0.28 micron lines and 0.14 micron spaces at both room temperature(20° C.) and at 40° C. The process involved immersing the substrate samples in a bath containing the composition of example 1; removing the substrate samples from the bath; rinsing with deionized water; and drying under a nitrogen sparge. At room temperature the immersion time was 20 minutes. At 40° C. the immersion time was 10 minutes. The ash and etch residue was removed at both temperatures without reducing the width of the metal lines (Al/Si/Cu alloy). The formulation had an oxide etch rate of ~0.3 angstroms/min. at 20° C. and ~2.0 angstroms/min at 40° C.

EXAMPLE 4

The formulation of example 1 was used to remove novolak photoresist and etch residues from an etched via pattern. The etched via was immersed in a bath equilibrated at 20° C. containing the composition of example 1. Immersion time was 15 minutes. The etched via pattern was subsequently washed with deionized water and dried under nitrogen. The photoresist and etch residue were removed without measurably altering the via size.

EXAMPLE 5

The rate of etch of an Al/Cu alloy, titanium, tungsten, a TiN alloy, and thermal oxide in a bath containing the composition of example 1 was measured at 20° C., 40° C., and 60° C. The immersion bath method of example 3 was used. Metal etch rates were determined with a Veeco FPP-5000 four-point probe system for blanket metal films on thermal oxide. Thermal oxide etch rates were determined with nanospec AFT optical thickness measurement tool. Etch rates are in Angstroms/minute. Results are given below in Table II.

TABLE II (Etch rates in Å/min)

| Temperature (° C.) | Al/Cu Alloy | Titanium | Tungsten | TiN Alloy | Thermal Oxide |
|---|---|---|---|---|---|
| 20 | 2 | <1 | <1 | 0 | 0.3 |
| 40 | 3 | 6 | <1 | 0 | 2 |
| 60 | 3 | 15 | <1 | 0 | 17.5 |

EXAMPLE 6

A composition was prepared by mixing the following:

| Component | Wt % |
|---|---|
| Acetic acid (glacial) | 2.6 |
| Ammonium acetate | 2.6 |
| DMAC | 64.9 |
| Ammonium fluoride (40% aq) | 1.25 |
| Water (deionized) | 29.25 |

EXAMPLE 7

A composition was prepared by mixing the following:

| Component | Wt % |
|---|---|
| Acetic acid (glacial) | 0.5 |
| Ammonium acetate | 0.2 |
| DMAC | 73.90 |
| Ammonium fluoride (40% aq) | 0.4 |
| Water (deionized) | 25.0 |

The pH of the composition fell within the pH range of from 3 to 7. The surface tension of the composition was 46 mN/m.

EXAMPLE 8

A composition was prepared by mixing the following:

| Component | Wt % |
|---|---|
| Acetic acid (glacial) | 0.5 |
| Ammonium acetate | 0.65 |
| THFA | 78.45 |
| Ammonium fluoride (40% aq) | 0.4 |
| Water (deionized) | 20 |

The pH of the composition fell within the pH range of from 3 to 7. The surface tension of the composition was 43.5 mN/m.

Differences in etch rates of various metals for Examples 6, 7, and 8 were determined for a temperature of 25° C. and an exposure time of 60 minutes. The metals included Al/Cu (4% alloy), Cu, and TEOS. Metal etch rates were determined using a CDE ResMap 273 and a standard procedure E-M-DGLAB-0007, CDE ResMap 273 Four Point Probe Etch Rate. Test wafers consisted of the appropriate metal on $SiO_2$ on silicon. Results are provided in Table III.

A substrate containing TEOS on Al was contacted with the composition of Example 6 and 8 at 25° C. for a period of 30 minutes. Each wafer was inspected via scanning electronic microscopy before and after contact. The insepection showed tha both compositions were effective in removing while preserving via features with minimal corrosion.

TABLE III (Etch rates in Å/min)

| Formulation | Al | Cu | TEOS |
|---|---|---|---|
| Example 6 | 4 | 3 | 32 |
| Example 7 | 2 | 15 | <1 |
| Example 8 | 3 | 13 | 21 |

The invention claimed is:

1. A composition for removing residue, the composition consisting of:
   an acidic buffer solution having a weak acid selected from a carboxylic acid or a polybasic acid and an ammonium salt of the acid in a molar ratio of acid to ammonium salt ranging from 10:1 to 1:10;
   tetrahydrofurfuryl alcohol;
   a fluoride, wherein the fluoride is selected from the group consisting of: ammonium fluoride, tetramethyl ammonium fluoride, tetraethyl ammonium fluoride and mixtures thereof;
   water; and
   optionally, a corrosion inhibitor,
   wherein the composition has a pH ranging from about 3 to about 7.

2. The composition of claim 1 employing the corrosion inhibitor.

3. The composition of claim 2 wherein the corrosion inhibitor is at least one selected from anthranilic acid, gallic acid, benzoic acid, malonic acid, maleic acid, fumaric acid, D,L-malic acid, isophthalic acid, phthalic acid, maleic anhydride, phthalic anhydride, catechol, pyrogallol, esters of gallic acid, benzotriazole, carboxybenzotriazole and mixtures thereof.

4. The composition of claim 2 wherein the corrosion inhibitor has a pKa of less than about 6.

5. The composition of claim 1 wherein the acid within the acidic buffer solution comprises acetic acid and wherein the ammonium salt within the acidic buffer solution comprises ammonium acetate.

6. The composition of claim 1 wherein the acid within the acidic buffer solution comprises phosphoric acid and wherein the ammonium salt within the acidic buffer solution comprises an ammonium salt of phosphoric acid.

7. The composition of claim 1 wherein the molar ratio is substantially 1:1.

8. A method of removing residue from a substrate, comprising the step of applying a composition according to claim 1 to the substrate at a temperature of from 20° C. to 80° C. for a period of time sufficient to remove the residue from the substrate.

9. The method as claimed in claim 8, wherein the temperature is from 20° C. to 60° C.

10. A method for defining a pattern comprising:
    coating a photoresist onto at least a portion of the substrate;
    lithographically defining a pattern on the photoresist;
    transferring the pattern onto at least a portion of the substrate; and
    removing the photoresist, processing residue, and mixtures thereof by contacting the substrate with a composition according to claim 1.

* * * * *